(12) United States Patent
Kubo (10) Patent No.: US 7,508,856 B2
(45) Date of Patent: Mar. 24, 2009

(54) LASER LIGHT OUTPUT CONTROL APPARATUS AND IMAGE FORMING APPARATUS

(75) Inventor: Isao Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 22 days.

(21) Appl. No.: 11/846,099

(22) Filed: Aug. 28, 2007

(65) Prior Publication Data

US 2008/0056318 A1   Mar. 6, 2008

(30) Foreign Application Priority Data

Aug. 29, 2006   (JP) .............................. 2006-232346

(51) Int. Cl.
*H01S 3/00*   (2006.01)
(52) U.S. Cl. .............................. 372/38.02; 372/29.014; 372/38.01; 347/247
(58) Field of Classification Search . 372/29.01–29.016, 372/29.021, 31, 38.1, 38.01–38.09; 347/118, 347/130, 246, 247; 358/1.7, 510; 399/4
See application file for complete search history.

(56) References Cited

U.S. PATENT DOCUMENTS

| | | | |
|---|---|---|---|
| 5,548,320 A | | 8/1996 | Yamanaka et al. |
| 6,560,256 B1 | * | 5/2003 | Seki et al. ................. 372/38.02 |
| 6,795,656 B1 | * | 9/2004 | Ikeuchi et al. ............... 398/197 |
| 2006/0023761 A1 | * | 2/2006 | Moriyama ............... 372/38.02 |

FOREIGN PATENT DOCUMENTS

| | | |
|---|---|---|
| JP | 05103161 | 4/1993 |
| JP | 06006533 | 1/1994 |
| JP | 06112564 | 4/1994 |
| JP | 07-074419 | * 3/1995 |

(Continued)

OTHER PUBLICATIONS

Notice of Reasons for Refusal for Japanese Patent Application No. 2006-232346, Mailing Date: Jul. 29, 2008.

*Primary Examiner*—Minsun Harvey
*Assistant Examiner*—Tod T Van Roy
(74) *Attorney, Agent, or Firm*—Banner Witcoff, Ltd (57) ABSTRACT

One aspect of the present invention can include a laser light output control apparatus having a plurality of laser light output control systems including a laser light source capable of receiving supplying of current via a power supplying path from a power source and irradiating laser light, a photo-detecting device capable of receiving the light irradiated from the laser light source and outputting a monitor current dependent on the amount of light received, a conversion circuit capable of converting the monitor current into a voltage value, a control circuit capable of controlling the current supplied to the laser light source based on the voltage value outputted from the conversion circuit so that the intensity of laser light irradiated from the laser light source changes to a predetermined value, the respective conversion circuits of each said output control system have a fixed resistor and a variable resistor connected in series to each other, and at least one of the fixed resistors of each said plurality of laser light output control system has a resistance value different from the fixed resistors of the other plurality of laser light output control systems.

16 Claims, 9 Drawing Sheets

FOREIGN PATENT DOCUMENTS

| | | |
|---|---|---|
| JP | 08-137346 | 5/1996 |
| JP | 10052939 | 2/1998 |
| JP | 11330599 | 11/1999 |
| JP | 2000238331 | 9/2000 |
| JP | 2002086794 | 3/2002 |
| JP | 2004-071084 | 3/2004 |

* cited by examiner

| | LIGHT INTENSITY | | RESISTANCE VALUE | | THE AMOUNT OF CHANGE OF RESISTANCE VALUE WITH RESPECT TO ROTATING OPERATION ANGLE |
|---|---|---|---|---|---|
| | LOWER LIMIT | UPPER LIMIT | FIXED RESISTOR | VARIABLE RESISTOR | |
| LD1 | 8mW | 17mW | 1.0kΩ | 0~10kΩ | SMALL |
| LD2 | 4mW | 10mW | 3.0kΩ | 0~15kΩ | MIDDLE |
| LD3 | 5mW | 11mW | 1.5kΩ | 0~15kΩ | MIDDLE |
| LD4 | 3mW | 8mW | 3.6kΩ | 0~20kΩ | LARGE |

FIG.7

LASER LIGHT OUTPUT CONTROL APPARATUS AND IMAGE FORMING APPARATUS

CROSS REFERENCE TO RELATED APPLICATION

This application claims priority from Japanese Patent Application No. 2006-232346 filed Aug. 29, 2006. The entire content of this/these priority application is incorporated herein by reference.

TECHNICAL FIELD

The present invention relates to a laser light output control apparatus and an image forming apparatus.

BACKGROUND

Laser printers have included a photosensitive member that is scanned with laser light to be exposed to light, thereby forming an electrostatic latent image; then the electrostatic latent image is subjected to processes of development, transfer, and fixing, whereby the image is formed on a sheet. In the laser printer of this type, an APC control (automatic power control) functions to control laser light so that the intensity is at a constant level. The APC control circuit also includes a light intensity adjustment function.

In recent years, color laser printers have become widely popular. The color laser printers have laser light sources and photosensitive members arranged separately in a manner corresponding to each color, and the laser light sources are each equipped with the APC control circuit.

Thus, there is a need in the art from a laser light output control apparatus capable of irradiating, at proper light intensity, laser light on photosensitive members of each color, and an image forming apparatus with the same.

SUMMARY

One aspect of the present invention can include a laser light output control apparatus having a plurality of laser light output control systems including a laser light source capable of receiving supplying of current via a power supplying path from a power source and irradiating laser light, a photo-detecting device capable of receiving the light irradiated from the laser light source and outputting a monitor current dependent on the amount of light received, a conversion circuit capable of converting the monitor current into a voltage value, a control circuit capable of controlling the current supplied to the laser light source based on the voltage value outputted from the conversion circuit so that the intensity of laser light irradiated from the laser light source changes to a predetermined value, the respective conversion circuits of each said output control system have a fixed resistor and a variable resistor connected in series to each other, and at least one of the fixed resistors of each said plurality of laser light output control system has a resistance value different from the fixed resistors of the other plurality of laser light output control systems.

BRIEF DESCRIPTION OF THE DRAWINGS

Illustrative aspects in accordance with the invention will be described in detail with reference to the following figures wherein.

DETAILED DESCRIPTION

An illustrative aspect of the present invention will now be described with reference to FIGS. 1 to 8.

Figure 1:
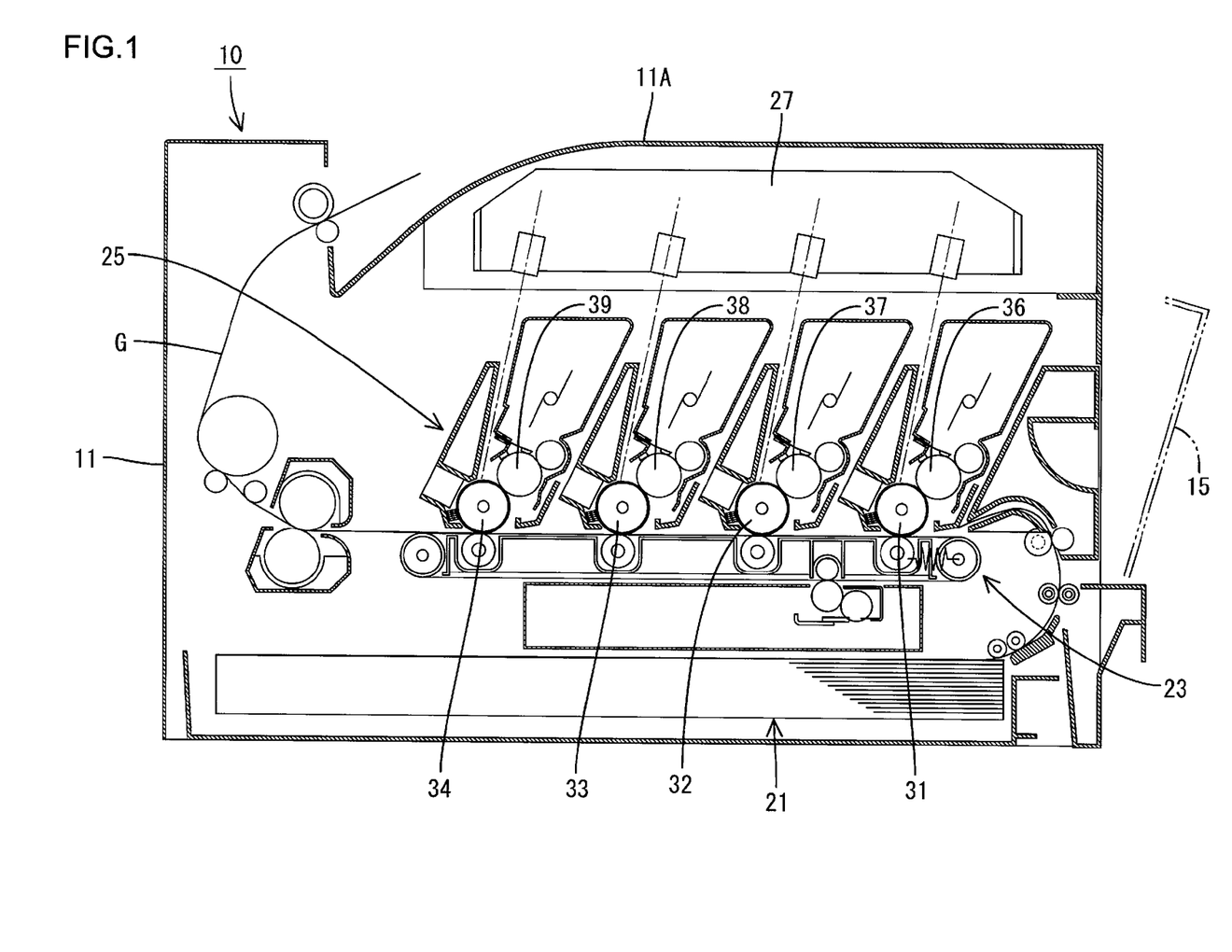
FIG. 1 is a substantial side cross-sectional view of a laser printer according to an illustrative aspect of the present invention.

FIG. 1 is a substantial side cross-sectional view illustrating a schematic configuration of a laser printer 10 according to the present illustrative aspect. The laser printer 10 (an example of "image forming apparatus") is what is called a direct-tandem type color laser printer provided with photosensitive drums (an example of "photosensitive member") 31, 32, 33, 34 and development rollers (an example of "development device") 36, 37, 38, 39, each of which can correspond to different colors (e.g. black, cyan, magenta and yellow). It is noted that, in the following description, "front side" indicates the right side of FIG. 1.

The laser printer 10 includes a main body casing 11 in a box shape. Inside the main body casing 11, a sheet feeding section 21, a sheet conveying section 23 conveying a sheet, an image forming section 25 forming an image on a sheet, and a scanner section 27 working as an exposing device are arranged upwardly in this order in a stacked manner. On the front face of the main body casing 11, there is arranged an access opening; a front cover (an example of "cover") 15 is hingedly arranged therein. Accordingly, the access opening can be closed or opened. The term sheet is broadly defined as a recording medium, which can include or be made of paper, plastic, or the like.

The scanner section 27 has incorporated therein a polygon mirror (not illustrated) and laser diodes (an example of "laser light source") LD1 to LD4 corresponding to each different color (e.g. black, cyan, magenta and yellow). Each laser light irradiated from the laser diodes LD1 to LD4 is deflected by the polygon mirror and passes through an lens (not illustrated). Thereafter, the resultant light has its direction changed by optical components, such as a reflecting mirror, installed on its light path and is irradiated, as illustrated in FIG. 1, by high-speed scanning on the surface of the respective photosensitive drums 31, 32, 33, 34. Accordingly, electrostatic latent images are formed on the respective photosensitive drums 31 to 34. Thereafter, by performing processes of development, transfer, and fixing, an image is formed on a sheet conveyed on a sheet conveyance path G; and after the image formation, the sheet is discharged onto a discharge tray arranged in an upper-face wall 11A of the main body casing 11.

The circuit configuration of a laser light output control apparatus (hereinafter referred simply as an output control apparatus) U will now be described with reference to FIG. 2.

The output control apparatus U can include the above described laser diodes LD1 to LD4 and automatic power control devices Z1 to Z4 arranged respectively in a manner corresponding to each laser diode LD1 to LD4. In FIG. 2, the fourth automatic power control device Z4 is omitted.

Figure 2:
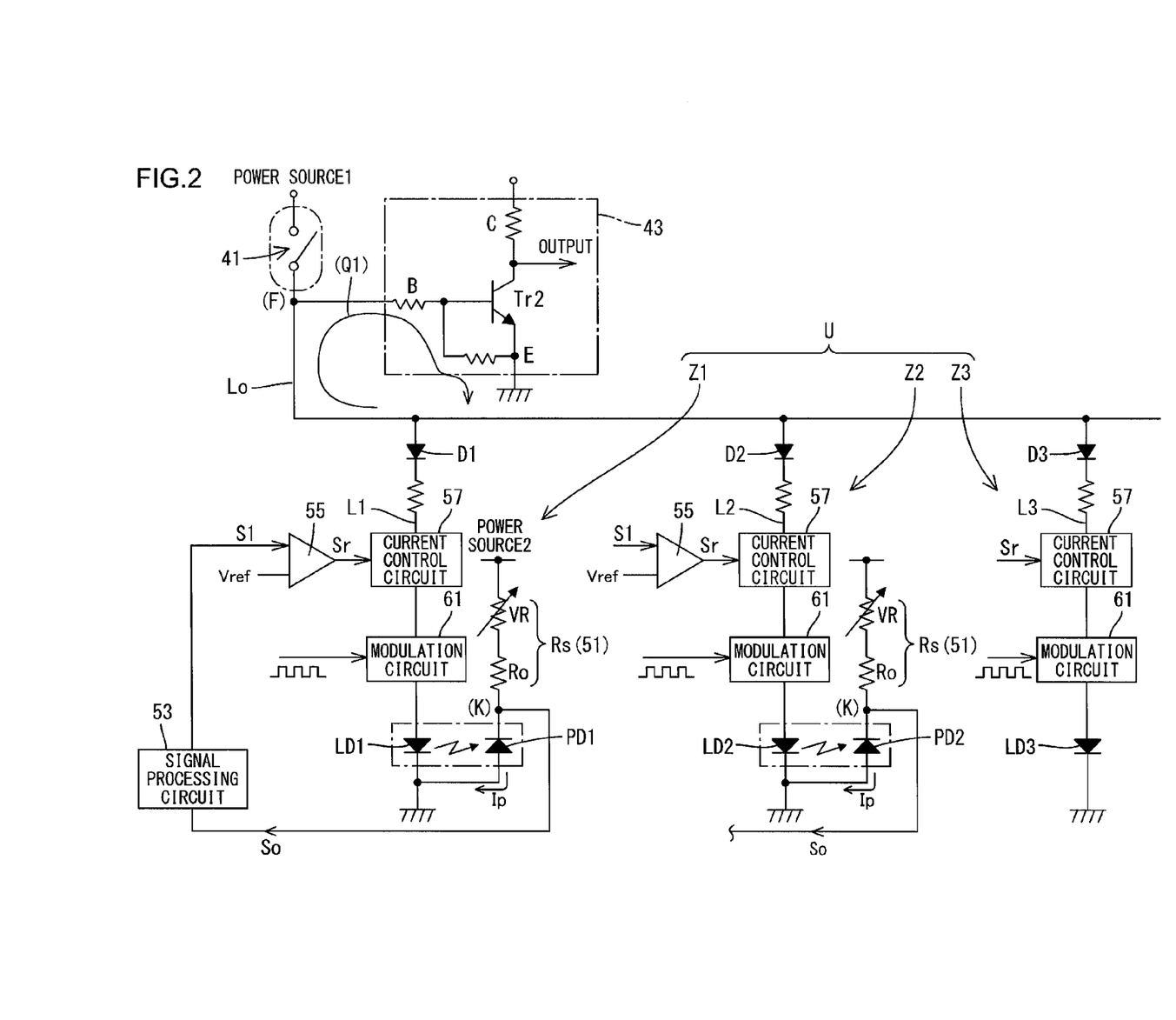
FIG. 2 is a circuit diagram of an output control apparatus.

As illustrated in FIG. 2, four power supplying paths L1 to L4 are connected in a branched manner to a power source line Lo leading to a power source 1. The laser diodes LD1 to LD4 are forward-connected to these power supplying paths L1 to L4, respectively. Accordingly, drive current is supplied from the power source 1 to the laser diodes LD1 to LD4, whereby laser light is irradiated.

The power source line Lo is provided with a mechanical connecting switch (an example of "first switch") 41. This connecting switch 41 opens the power source line Lo in response to opening of the front cover 15, and closes the power source line Lo in response to closing of the front cover 15. Accordingly, in a state, such as during printing, in which drive current is being supplied to the laser diodes LD1 to LD4, when the front cover 15 is opened, the supplying of drive current to the laser diodes LD1 to LD4 is simultaneously stopped to interrupt the irradiation of laser light.

The automatic power control devices Z1 to Z4 can include photo diodes (an example of "photo-detecting device") PD1 to PD4, an I/V conversion circuit (an example of "conversion circuit") 51, a signal processing circuit 53, an error amplifier (an example of "error amplifier") 55, a current control circuit (an example of "control circuit") 57, and the like. The automatic power control devices Z1 to Z4 have the same basic circuit configuration, so the automatic power control device Z1 for the laser diode LD1 will be described below as representative.

The photo diode PD1 is sealed inside the same package as the laser diode LD1; the cathode of the laser diode LD1 is connected to the anode of the photo diode PD1.

Between the cathode of the photo diode PD1 and a power source 2, there is arranged the I/V conversion circuit 51 having a resistor couple Rs obtained by connecting in series a variable resistor VR and a fixed resistor Ro.

Accordingly, when laser light is irradiated from the laser diode LD1, that light is received by the photo diode PD1. Then, a monitor current Ip dependent on the laser light intensity is outputted from the photo diode PD1, and this is converted into a voltage by the resistor couple Rs.

Then, the potential at the cathode of the photo diode PD1 (the potential at point K in FIG. 2) is inputted as a monitor voltage So to the signal processing circuit 53. The potential at point K is a voltage obtained by subtracting a voltage drop occurring at the resistor couple Rs from the voltage value of power source 2. Thus, when the monitor current Ip is large, the potential is low; on the contrary, when the monitor current Ip is small, the potential is high.

The signal processing circuit 53 can include a peak hold circuit, an inversion circuit and the like. When a monitor signal So is inputted thereto, the circuit 53 detects a peak value and inverts and outputs it. Accordingly, a monitor voltage S1 corresponding to the amplitude of voltage drop occurring at the resistor couple Rs is outputted from the signal processing circuit 53, and then inputted to the error amplifier 55.

When receiving the monitor voltage S1, the error amplifier 55 outputs to the current control circuit 57 a control signal Sr dependent on a difference from a reference voltage Vref.

The current control circuit 57 is arranged in the power supplying path L1 for the laser diode LD1, and controls the amount of drive current supplied to the laser diode LD1 according to the control signal Sr outputted from the error amplifier 55. More specifically, when the monitor voltage S1 exceeds the reference voltage Vref, the drive current is reduced; on the contrary, when the monitor voltage S1 falls below the reference voltage Vref, the drive current is increased.

Accordingly, the intensity of laser light irradiated from the laser diode LD1 is controlled at a constant control target value. Thus, it is possible to suppress laser output variations dependent on temperature characteristics of the laser diode LD1, or on laser output variations caused by temporal changes.

Also, the above described automatic power control device Z1 is provided with a function of adjusting the control target value of light intensity via the variable resistor VR of the I/V conversion circuit 51.

More specifically, in a stable state where the intensity of laser light is controlled at a constant control target value, the monitor voltage S1, i.e., the voltage drop at the resistor couple Rs, is equal to the reference voltage Vref.

In this state, when the variable resistor VR is manipulated to reduce its resistance value, even if a monitor current Ip of the same amplitude flows in the resistor couple Rs, the voltage drop occurring at the resistor couple Rs decreases. Then, the monitor voltage S1 falls below the reference voltage Vref, and thus controlling the increasing of the output is performed by the error amplifier 55 and current control circuit 57, raising the light intensity of the laser diode LD1.

In this way, when the variable resistor VR is manipulated to reduce the resistance value of resistor couple Rs, the control target value of light intensity can be set higher: on the contrary, when the resistance value of resistor couple Rs is increased, the control target value of light intensity can be set lower.

Figure 3:
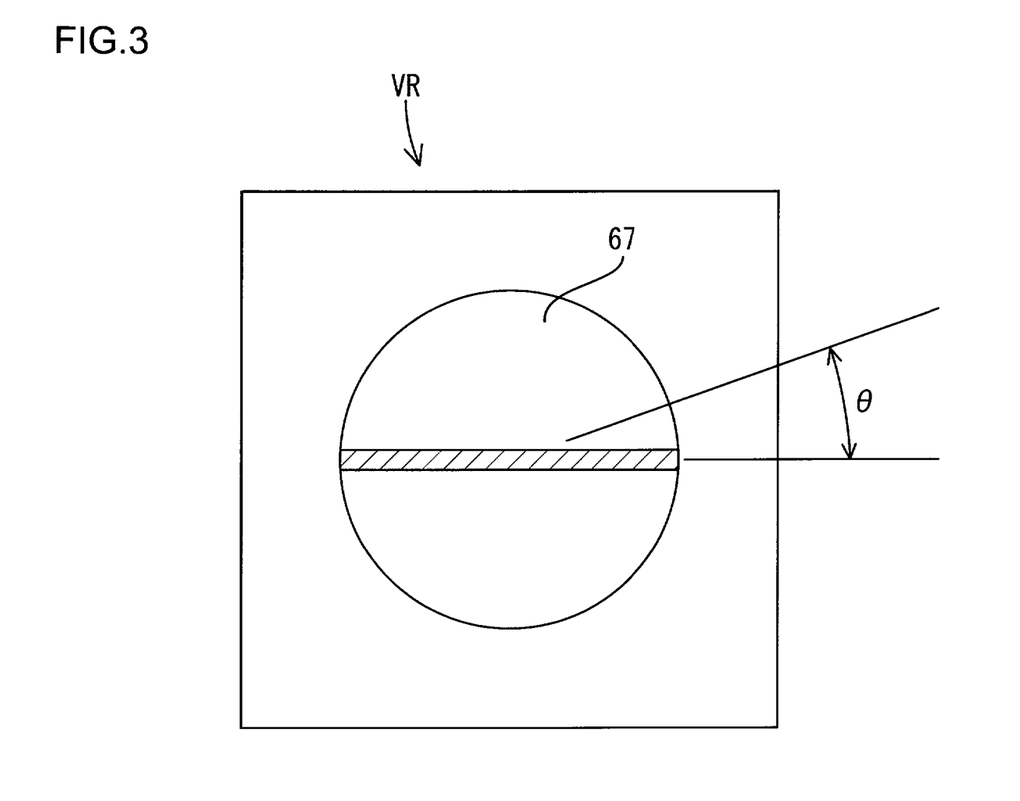
FIG. 3 is a plan view of a variable resistor.

In the present illustrative aspect the variable resistor VR can be a rotary knob (an example of "rotary operator") 67 illustrated in FIG. 3, and the resistance value of variable resistor VR can be varied by a rotating operation.

With the rotating operation, the operation of varying the resistance value can be performed easier, thus facilitating the later-described light intensity adjustment operation.

Figure 4:
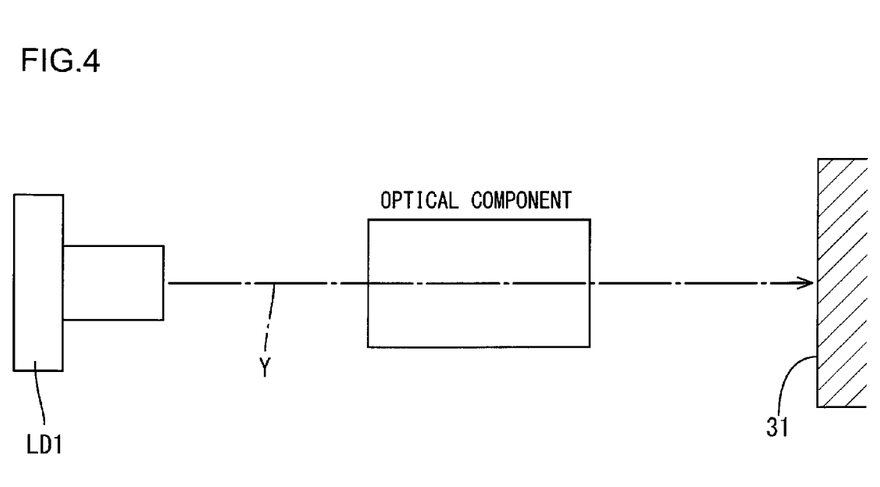
FIG. 4 is a view for explaining laser light loss occurring on an optical path.

The adjustment of control target value by the variable resistor VR can be performed during manufacture, for example. This is because there are as illustrated in FIG. 4, various types of optical components on an optical path Y of the laser diode LD1. Laser light loss can occur during a period from when irradiated to when reaching the photosensitive drum 31.

Accordingly, during manufacture, the control target value is adjusted according to the laser light loss occurring on the optical path Y. However, the laser light loss occurring on the optical path Y varies among the laser diodes LD1 to LD4. In order to ensure satisfactory image quality, it is adequate to irradiate laser light at a light intensity (for example, the same light intensity) suitable for all the photosensitive drums 31 to 34.

Thus, according to the present illustrative aspect, a resistance value Xo of the fixed resistor Ro and a maximum resistance value Xm of the variable resistor VR are determined as follows.

The light intensity of the laser diode LD is detected as a monitor current Ip. Thus, when the light intensity required as an adjustment range when loss is considered to be, for example, 8 mW to 17 mW, a resistance value Xo of the fixed resistor Ro and a maximum resistance value Xm of the variable resistor VR are determined so as to allow a monitor current Ip corresponding to the light intensity of 8 mW to 17 mW to flow.

Meanwhile, the voltage drop at the resistor couple Rs is controlled at all times to be a constant value (Vref). Accordingly, the monitor current Ip, which can flow in the resistor couple Rs, can have an upper limit provided by the following formula (1), and a lower limit by the following formula (2).

$$Ia = Vref/Xo \qquad (1)$$

$$Ib = Vref/(Xo+Xm) \qquad (2)$$

Figure 5:
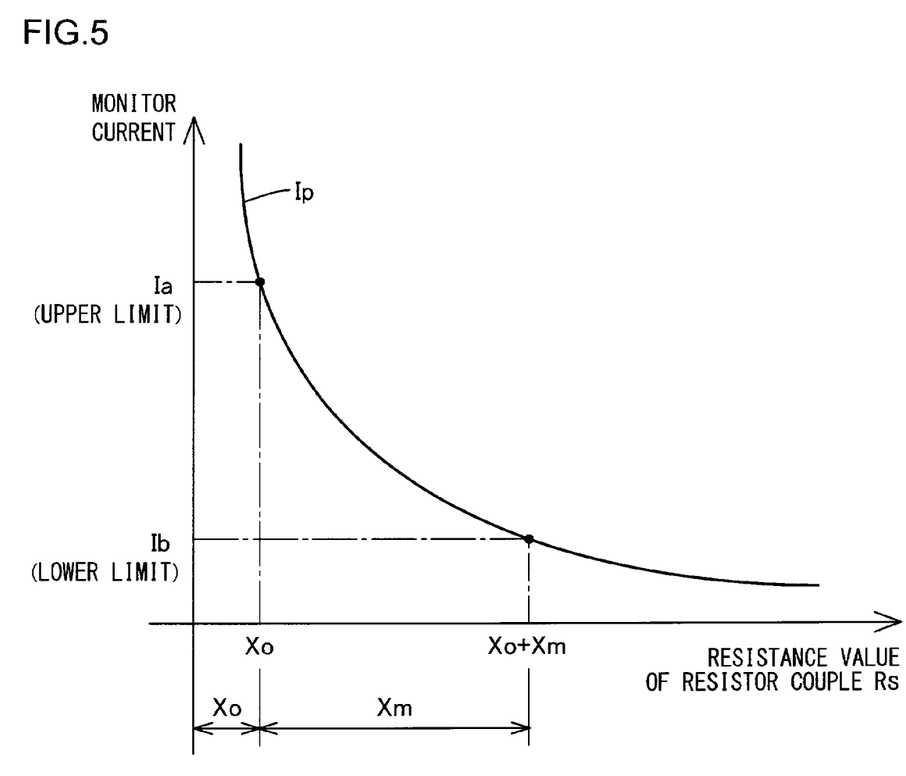
FIG. 5 is a view illustrating a relationship between the resistance value of a resistor couple and the monitor current.

Ia is a maximum value (upper limit) of monitor current Ip, and Ib is a minimum value (lower limit) of monitor current Ip. FIG. 5 illustrates a graph of the relationship between the resistance value of resistor couple Rs and the monitor current Ip.

From the above description, if a monitor current Ia corresponding to the light intensity upper limit value of 17 mW is calculated, a resistance value Xo of fixed resistor Ro can be calculated from the formula (1). Also, if a monitor current Ib corresponding to the light intensity lower limit value of 8 mW is calculated, a maximum resistance value Xm of variable resistor VR can be calculated from the formula (2).

Figure 6:
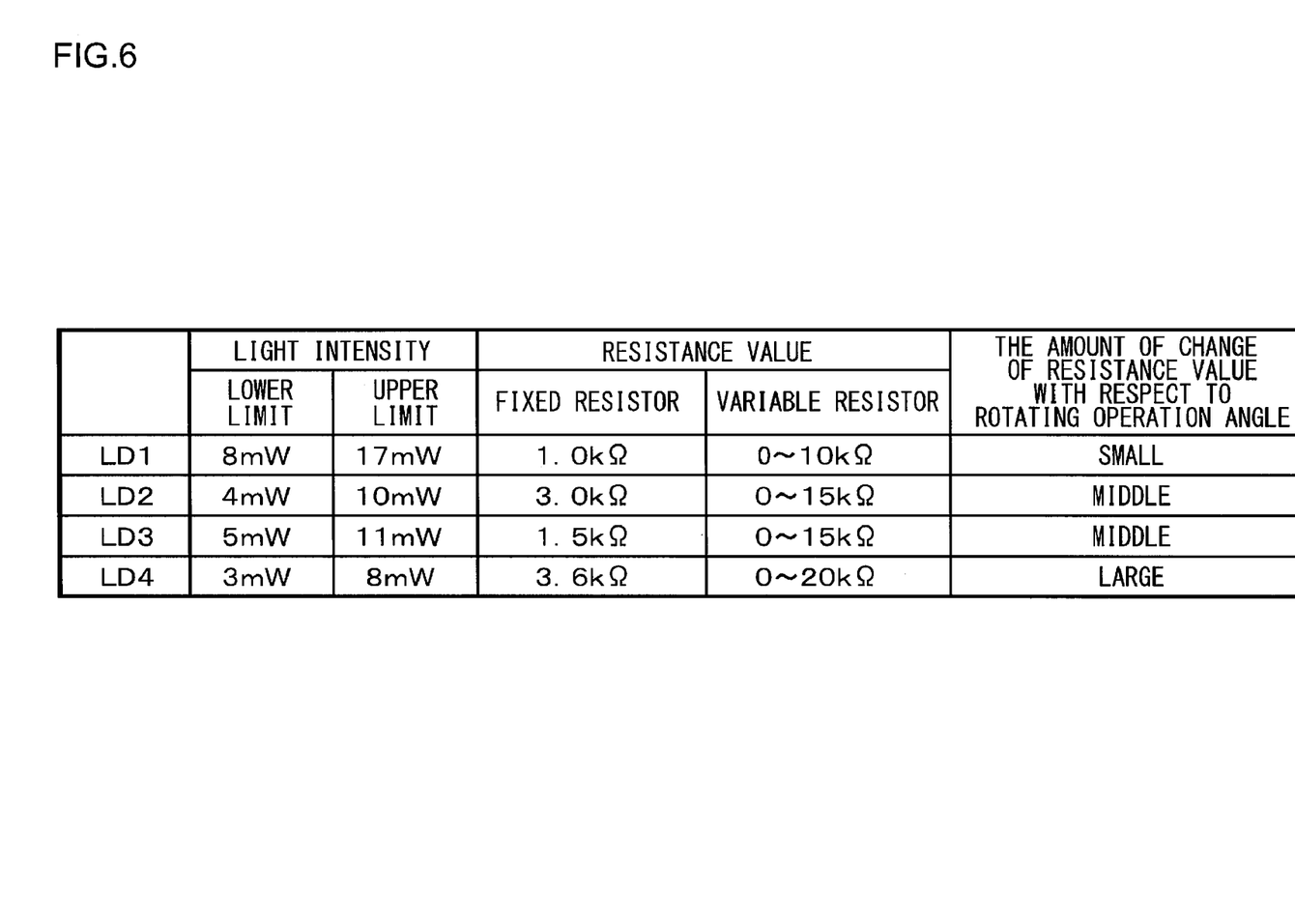
FIG. 6 is a view illustrating a relationship between the resistance value of a fixed resistor, the resistance value of a variable resistor, and light intensity.

According to the present illustrative aspect, as illustrated in FIG. 6, in the laser diode LD1, the resistance value Xo of fixed resistor Ro is set to 1.0 KΩ, and the maximum resistance value Xm of variable resistor VR is set to 10 KΩ, and the control target value of light intensity can be adjusted between 8 mW and 17 mW. In the laser diode LD2, the resistance value Xo of fixed resistor Ro is set to 3.0 KΩ, and the maximum resistance value Xm of variable resistor VR is set to 15 KΩ, and the control target value of light intensity can be adjusted between 4 mW and 10 mW.

In the laser diode LD3, the resistance value Xo of fixed resistor Ro is set to 1.5 KΩ, and the maximum resistance value Xm of variable resistor VR is set to 15 KΩ, and the control target value of light intensity can be adjusted between 5 mW and 11 mW. In the laser diode LD4, the resistance value Xo of fixed resistor Ro is set to 3.6 KΩ, and the maximum resistance value Xm of variable resistor VR is set to 20 KΩ, and the control target value of light intensity can be adjusted between 3 mW and 8 mW.

Thus, as the adjustment range of light intensity, adjustment ranges capable of properly coping with laser light loss and loss variations occurring on the respective optical paths Y can be ensured with respect to the automatic power control devices Z1 to Z4, respectively. Consequently, it is possible to irradiate laser light at a light intensity suitable for each of the photosensitive drums 31 to 34, and thus satisfactory image quality can be ensured.

According to the above formula (2), the lower limit becomes small as the maximum resistance value Xm of variable resistor VR becomes large. More specifically, in the laser diode LD1, the maximum resistance value of variable resistor VR is set to 10 KΩ, but when the maximum resistance is increased to the same value of 20 KΩ as the laser diode LD4, the lower limit lowers from 8 mW to 4 mW.

In this case, the adjustment range of the laser diode LD1 broadens and at the same time the resistance of each variable resistor VR is set to be the same. However, according to the present illustrative aspect, the adjustment range for the laser diodes LD1 to LD4 is not broadened, and the resistance value of variable resistor VR is set separately for each of the laser diodes LD1 to LD4. In other words, in at least one of the variable resistors VR of the automatic power control devices Z1 to Z4, the maximum resistance value Xm is set different from those of the other variable resistors VR of the automatic power control devices Z1 to Z4.

When the setting is made in this manner, the amount of change of resistance value with respect to rotating operation angle is not large for the laser diodes LD1 to LD3. Here, "the amount of change of resistance value with respect to rotating operation angle" means the amount of change of resistance value with respect to operation angle θ illustrated in FIG. 3; as the maximum resistance value of variable resistor VR becomes large, the amount of change of resistance value becomes large.

As described above, the light intensity adjustment can be performed during manufacture, but since there are a plurality of laser diodes, it can be laborious to perform the adjustment. If the amount of change of resistance value with respect to rotating operation angle is large, the resistance value significantly varies by a slight operation and thus it takes time to adjust to the target value.

In this regard, according to the present illustrative aspect, in the laser diodes LD1 to LD3, the amount of change of resistance value is small or is moderately suppressed. Accordingly, for the laser diodes LD1 to LD3, fine adjustment is possible, and the light intensity can be adjusted to the target in a short time period, thus improving production efficiency.

Figure 7:
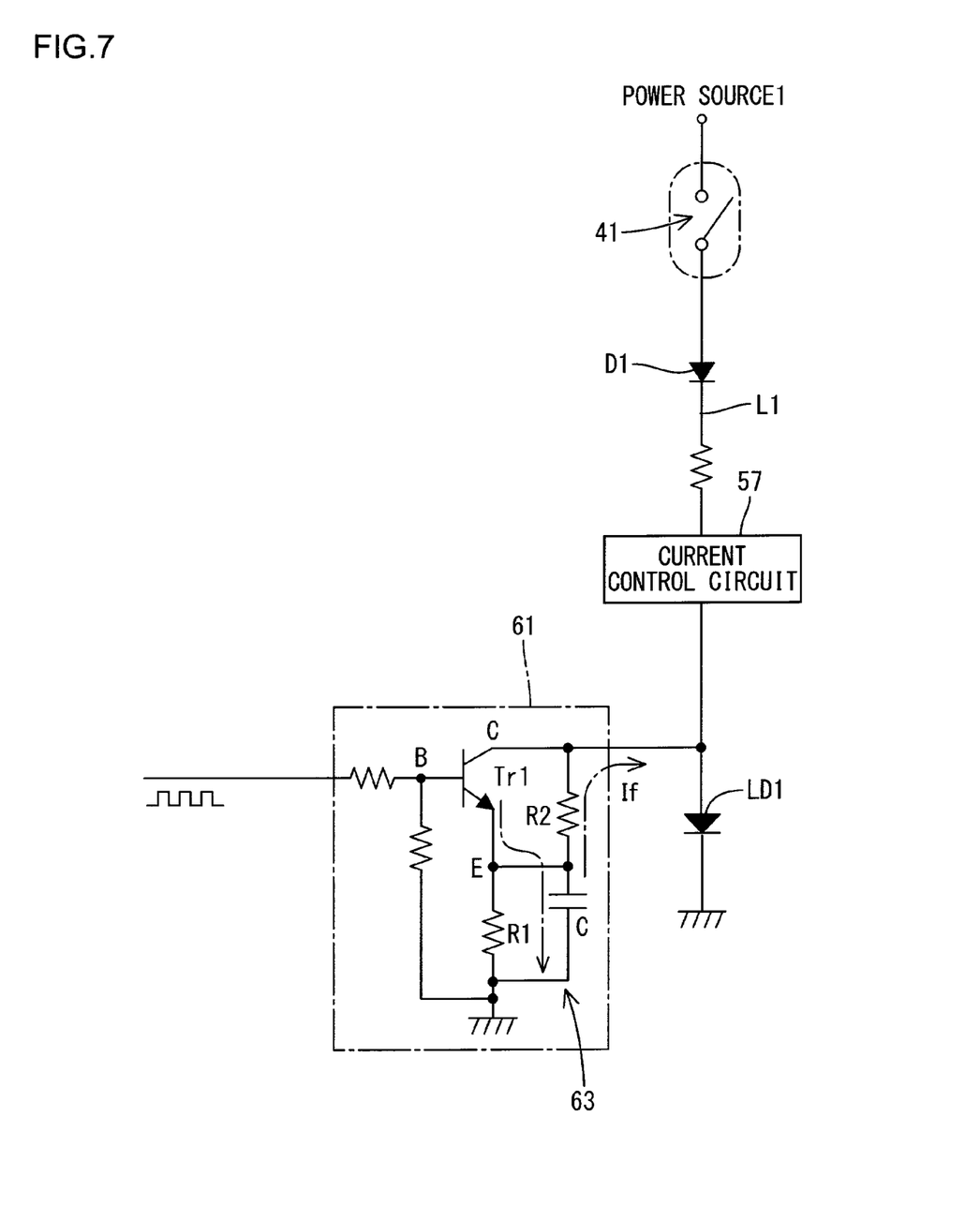
FIG. 7 is a circuit diagram of a modulation circuit.

In FIG. 2, reference numeral 61 denotes a modulation circuit. The modulation circuit 61 performs on/off control of the laser diode LD (hereinafter, LD1 will be exemplified) in order to a control signal inputted thereto. FIG. 7 illustrates the circuit configuration of the modulation circuit 61.

The modulation circuit 61 can include an NPN transistor (an example of "switching device") Tr1, a charging/discharging circuit 63 and the like. The collector of the NPN transistor Tr1 is connected to the anode of the laser diode LD1, the emitter is connected via an emitter resistance R1 to a ground line, and to the base thereof, there is inputted a control signal (a pulse signal in which high level and low level are alternately repeated) corresponding to printing data. Hereinafter, high level is referred to as H level, and low level as L level.

The charging/discharging circuit 63 can include an emitter resistor R1, a capacitor C and a discharging resistor R2. The capacitor C is connected in parallel to the emitter resistor R1, one end of the discharging resistor R2 is connected to the capacitor C, and the other end thereof is connected to the anode of the laser diode LD1.

The circuit operation will now be described.

When a pulse signal is inputted to the base, the NPN transistor Tr1 turns on in response to a H level of the signal. Accordingly, the NPN transistor Tr1 changes to a low-impedance state, and current flowing in the power supplying path L1 is absorbed by the NPN transistor Tr1.

Accordingly, supplying of drive current to the laser diode LD1 is stopped, and the laser diode LD1 changes to an OFF state (a light-off state). At this time, charging current is supplied to the capacitor C via a path indicated by a dashed line in FIG. 7, so that the capacitor C is charged.

Meanwhile, when the pulse signal changes from H level to L level, the NPN transistor Tr1 turns off. Accordingly, the NPN transistor Tr1 changes to a high-impedance state, so drive current is supplied via the power supplying path L1 to the laser diode LD1, and the laser diode LD1 changes to an ON state (a light-on state).

When the NPN transistor Tr1 is switched from ON to OFF, the capacitor C discharges charge (accumulated via the charging) through the discharging resistor R2, so a discharging current If is supplied to the laser diode LD1 in addition to current supplied from the power source 1.

In this way, when the laser diode LD1 is made to turn on (light-on)/off (light-off) in response to inputting of a pulse signal, an electrostatic latent image based on printing data can be formed on the surface of the photosensitive drums 31 to 34. Also, the following advantageous effect can be achieved by supplying the discharging current If.

Figure 8:
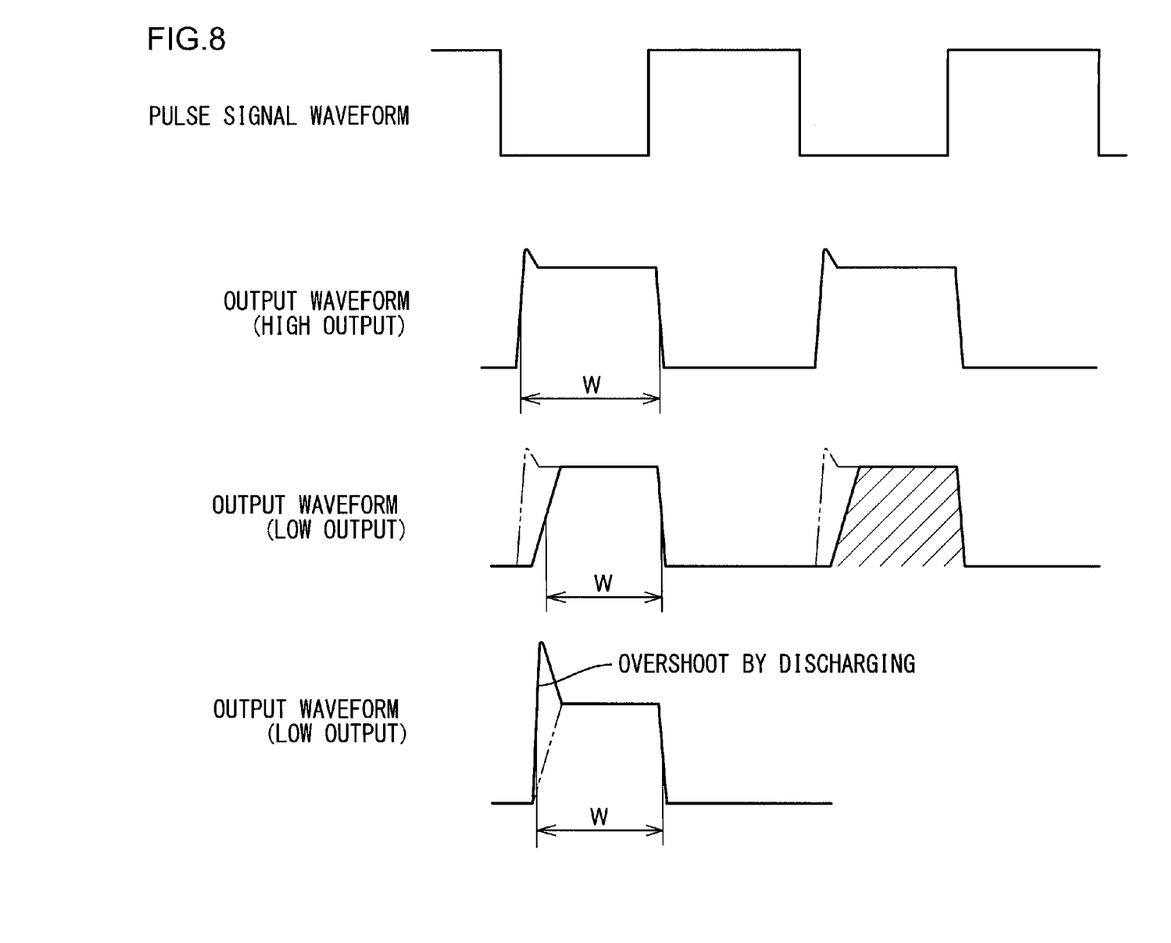
FIG. 8 is a view illustrating an output waveform of laser light.

Generally, in the rise characteristics of a laser diode LD, there is a response delay. In addition, the response delay tends to appear notably in a laser diode LD of a lower output. Referring to FIG. 8, in the upper stage there is illustrated a pulse signal waveform. In the second stage a laser diode LD output waveform at times of high output, and in the third stage a laser diode LD output waveform at times of low output. Compared to the laser diode LD output waveform at times of high output, the laser diode LD output waveform at times of low output begins to rise late, and in addition it takes a longer time to reach the target value after rising.

In this way, when there is a response difference according to the magnitude of output, even if the same pulse signal is supplied to the laser diodes LD1 to LD4, compared to the laser diode LD of high output, the laser diode LD of low output has a shorter pulse width W and in addition, has a lower output energy (the area indicated by hatching in FIG. 8). As a result, a given image quality may not be ensured.

In this regard, according to the present illustrative aspect, when the signal level of pulse signal changes from H level to L level, a discharging current If is supplied to the laser diode LD in addition to current supplied from the power source 1. As a result, as illustrated in the lower stage of FIG. 8, the output waveform rises with a sharp slope, and an overshoot occurs.

More specifically, the supplying of discharging current If works to quicken the response at times of low output and at the same time to compensate for the lowering of output energy. With this configuration, a given image quality can be ensured, irrespective of the level of laser diode LD output.

The above described charging/discharging circuit 63 is arranged in all the automatic power control devices Z1 to Z4. Accordingly, in the laser diode LD of high output, also, when the signal level of pulse signal changes from H level to L level, a discharging current If is supplied.

However, in the laser diode LD of high output, the amount of current supplied from the power source 1 is larger than the discharging current If, so the discharging current If does not affect the output. In other words, the amount of discharging current If is determined mainly by the capacitance of the capacitor C and the time constant of the charging/discharging circuit 63, but the above circuit constants are determined so that the output is affected only at times of low output.

The reason why all the automatic power control devices Z1 to Z4 are provided with the charging/discharging circuit 63 is that the capacitor C functions as a speed-up capacitor raising the response performance of the NPN transistor Tr1. More specifically, when the capacitor C is connected in parallel to the resistor R1, the emitter current of the NPN transistor Tr1 flows through the capacitor C into the ground. Consequently, compared to when the capacitor C is not installed, the switching of the NPN transistor Tr1 to an ON state is quickened.

In FIG. 2, reference numeral 43 denotes an operation detection circuit. The operation detection circuit 43 constitutes a stopping device along with a main control circuit (not illustrated), and performs a function of stopping all the automatic power control devices Z1 to Z4 all at once when the front cover 15 is opened to change the laser diodes LD1 to LD4 to an output stop state.

The operation detection circuit 43 is configured as an inverter, and outputs a voltage of L level when a voltage of H level is inputted to the base of an NPN transistor Tr2 (a state in which the connecting switch 41 is closed).

Meanwhile, the operation detection circuit 43 outputs a voltage of H level when a voltage of L level is inputted to the base of an NPN transistor Tr2 (a state in which the connecting switch 41 is opened). Thus, when the connecting switch 41 changes from a closed state to an opened state, the output of the operation detection circuit 43 changes from L level to H level. In response to this, the main control circuit (not illustrated) causes all the automatic power control devices Z1 to Z4 all to stop all at once.

Also, in the power supplying paths L1 to L4, there are forward-connected (the anode being connected to the power source side, the cathode being connected to the ground side) diodes D1 to D4, respectively. This prevents back current to the power source 1 side, achieving the following effects.

In a state where the connecting switch 41 is closed, the potential at point F of FIG. 2 is equal to the power source voltage, so back current does not flow. However, when the connecting switch 41 is opened, the power source line Lo is separated from the power source 1, thus back current may flow via a path (Q1) illustrated in FIG. 2 from the automatic power control devices Z1 side to the operation detection circuit 43. Particularly, according to the present illustrative aspect, there are arranged four automatic power control devices Z1 to Z4, so even when the back current flowing out from one automatic power control device is small, back current four times as large flows actually. Consequently, a large back current flows into the operation detection circuit 43.

In this case, the base potential of the NPN transistor Tr2 rises and thus the operation detection circuit 43 cannot perform the normal outputting. More specifically, the opening of the connecting switch 41 cannot be detected, and even when the connecting switch 41 changes from a closed state to an opened state, its output remains at L level.

Then, the main control device does not perform the control of stopping the automatic power control devices Z1 to Z4, and while the laser diodes LD1 to LD4 have stopped outputting, the automatic power control devices Z1 to Z4 remain active. In this regard, according to the present illustrative aspect, the diodes D1 to D4 for back current prevention are arranged in the power supplying paths L1 to L4, respectively; thus the above problem can be prevented.

According to the laser printer 10 of the present illustrative aspect, as the upper limit of required light intensity is set higher, the resistance value Xo of the fixed resistor Ro is set smaller; the resistance value Xo of the fixed resistor Ro is set separately for each of the automatic power control devices Z1 to Z4. In other words, in at least one of the automatic power control devices Z1 to Z4, the resistance value of the fixed resistor is set different from those of the other automatic power control devices Z1 to Z4. With this configuration, the upper limit of light intensity can be set separately for each of the automatic power control devices Z1 to Z4. Accordingly, the light intensity irradiatable from the laser diodes LD1 to LD4 is prevented from falling below the required light intensity. Consequently, higher light intensity can be preliminarily set for one having large loss and/or loss variations occurring on the optical path, and thus laser light can be irradiated at proper light intensity on the photosensitive drums 31 to 34, making it possible to ensure satisfactory image quality.

Another illustrative aspect of the present invention will now be described with reference to FIG. 9. According to another illustrative aspect, the reference voltage Vref is produced by a reference voltage production circuit 71, and this is supplied via an input line Lr to the error amplifiers 55 of the automatic power control devices Z1 to Z4.

The reference voltage production circuit 71 produces a pulse signal of a predetermined duty cycle, and this is inputted to an inverting amplifier circuit 75. The inverting amplifier circuit 75 can include an emitter-grounded NPN transistor (an example of "second switch") Tr3, a base resistor R3, a collector resistor R4 and a resistor R5, the input line Lr being connected to the collector of the NPN transistor Tr3.

Accordingly, when a pulse signal of a predetermined duty cycle is outputted from the reference voltage production circuit 71, this signal is inverted and amplified and outputted from the inverting amplifier circuit 75 (as an alternating voltage).

Further, respective input terminals (not illustrated) of each of the error amplifiers 55 are connected via a signal line to the input line Lr. Also, low-pass filters 55A are arranged at the input stage of each of the error amplifiers 55, respectively.

Accordingly, an alternating voltage inverted and amplified by the inverting amplifier circuit 75 is converted to a DC voltage by the low-pass filter 55A and thereafter inputted as the reference voltage Vref to each of the error amplifiers 55.

With this configuration, the value of reference voltage Vref supplied to the error amplifiers 55 can be varied by varying the duty cycle of the pulse signal. Since the input line Lr is shared by the error amplifiers 55, when the duty cycle is varied, the reference voltage Vref of all the error amplifiers 55 is varied all at once.

Figure 9:
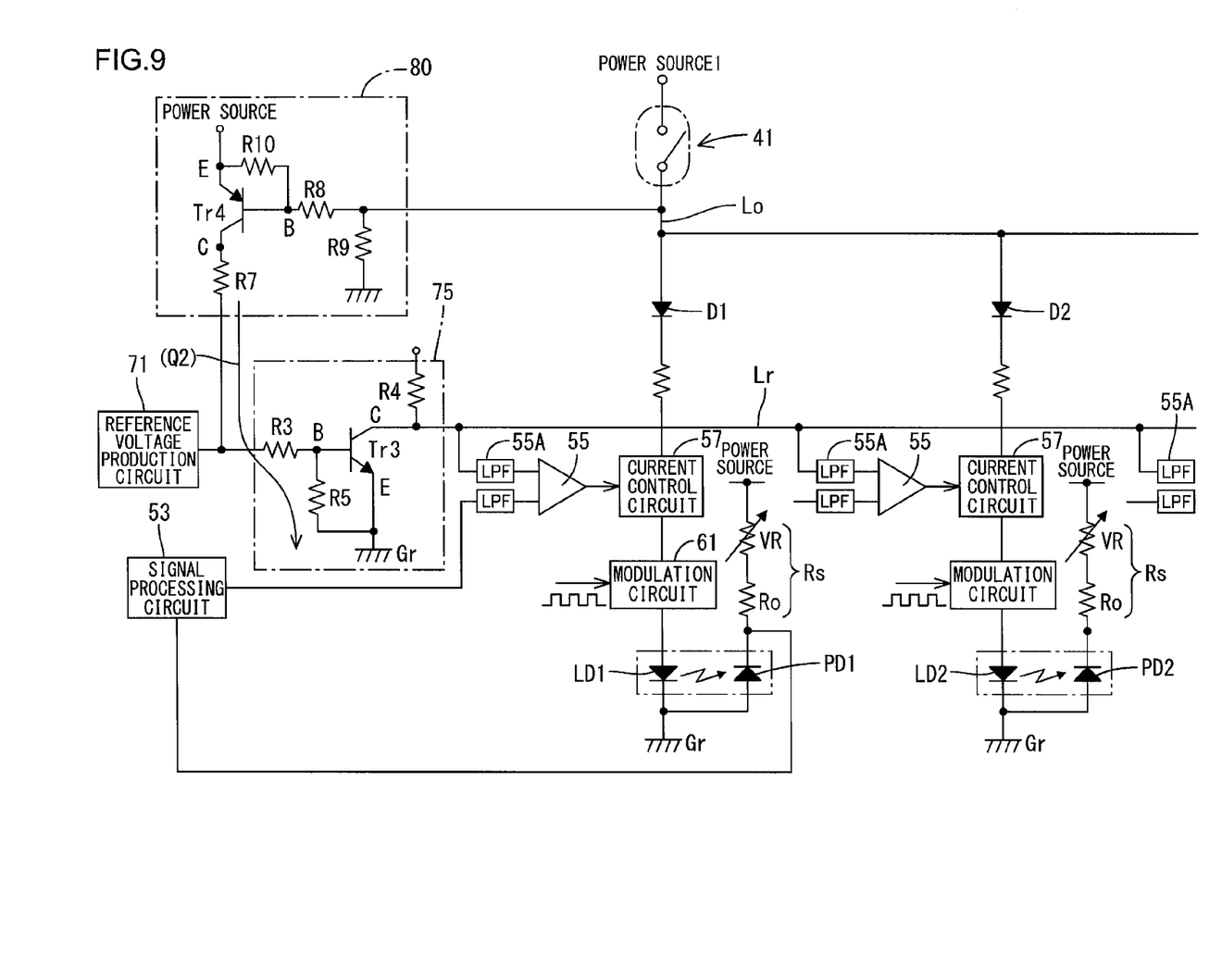
FIG. 9 is a view illustrating a circuit configuration of an output control apparatus according to another illustrative aspect.

In FIG. 9, reference numeral 80 denotes an operation detection circuit (an example of "detection circuit"). The operation detection circuit 80 is constituted of a PNP transistor Tr4 and four resistors R7 to R10. To explain more specifically, the emitter of the PNP transistor Tr4 is connected to a power source, and the base thereof is connected via the resistor R8 to the power source line Lo. The collector of the PNP transistor Tr4 is connected via the resistor R7 to the input stage of the inverting amplifier circuit 75.

In a state where the connecting switch 41 is closed, the base potential of the PNP transistor Tr4 is substantially equal to the voltage of the power source 1, and the PNP transistor Tr4 is in an OFF state. In this state, when the connecting switch 41 is opened, the base potential of the PNP transistor Tr4 lowers, so the PNP transistor Tr4 changes to an ON state. As a result, current flows via a path (Q2) illustrated in FIG. 9, raising the base voltage of the NPN transistor Tr3.

Accordingly, the collector current of the NPN transistor Tr3 increases, and thus the voltage drop at the collector resistor R4 increases. As a result, the voltage of the input line Lr lowers to substantially zero (i.e., a state where conduction to the ground line Gr is made), and thus the reference voltage Vref supplied to the error amplifiers 55 becomes zero. Thus, the power control by the automatic power control devices Z1 to Z4 is stopped all at once.

As described in regard to the previous illustrative aspect, the stopping device (which stops all at once the power control performed by the automatic power control devices Z1 to Z4 in response to the opening of the connecting switch 41) was configured by use of the operation detection circuit 43 and the main control device. However, according to the present illustrative aspect (another illustrative aspect), the stopping device is configured by use of the operation detection circuit 80 and inverting amplifier circuit 75. In the previously described illustrative aspect, includes an additional main control device (a device other than the output control apparatus Z), thus a long time period may elapse from when the connecting switch 41 is opened to when the power control is stopped all at once. But in the previously described illustrative aspect, since there is no additional main control device, the power control can be stopped all at once in a very short time period after the connecting switch 41 is opened.

When the stopping device of the previously described illustrative aspect and the stopping device of presently described illustrative aspect are simultaneously used, even if one of the stopping devices have a trouble, the power control by the automatic power control devices Z1 to Z4 can be stopped all at once by the other stopping device. Thus, a highly reliable system can be constructed.

Also, according to the present illustrative aspect (another illustrative aspect), the connecting switch 41 is arranged in the power source line Lo for supplying electric power to all the automatic power control devices Z1 to Z4. Consequently, the connecting switch 41 can be shared by all the automatic power control devices Z1 to Z4. Further, the error amplifiers 55 are each connected to the input line Lr in a shared manner. With this configuration, the NPN transistor Tr3 functioning as a switch for stopping the automatic power control device Z can also be shared by the automatic power control devices Z1 to Z4, allowing circuit simplification.

The expression "the connection state between both the lines is switched from a conduction state to a non-conduction state" used in the present invention means that the PNP transistor Tr4 is turned on to raise the base potential of the NPN transistor Tr3. This is implemented when the operating region is changed from the active region (or cutoff region) to the saturation region.

According to the one illustrative aspect and another illustrative aspect, the resistance value of the variable resistor VR is adjusted by a rotating operation; but it is sufficient to use a resistance-adjustable resistor as the variable resistor VR, and the resistance value may be adjusted by a sliding operation.

What is claimed is:

1. A laser light output control apparatus comprising:
    a plurality of laser light output control systems including:
        a laser light source capable of receiving supplying of current via a power supplying path from a power source and irradiating laser light;
        a photo-detecting device capable of receiving the light irradiated from the laser light source and outputting a monitor current dependent on the amount of light received;
        a conversion circuit capable of converting the monitor current into a voltage value; and
        a control circuit capable of controlling the current supplied to the laser light source based on the voltage value outputted from the conversion circuit so that the intensity of laser light irradiated from the laser light source changes to a predetermined value,
    wherein the respective conversion circuits of each said output control system have a fixed resistor and a variable resistor connected in series to each other, and
    wherein at least one of the fixed resistors of each said plurality of laser light output control system has a resistance value different from the fixed resistors of the other plurality of laser light output control systems.

2. The laser light output control apparatus according to claim 1, wherein the resistance value of the fixed resistor is determined based on an upper limit of light intensity of each laser light.

3. The laser light output control apparatus according to claim 2, wherein as the upper limit of light intensity of the laser light is set higher, the resistance value of the fixed resistor is set smaller.

4. The laser light output control apparatus according to claim 3, wherein at least one of the variable resistors of each said output control system has a maximum resistance value different from the variable resistors of the other output control systems.

5. The laser light output control apparatus according to claim 4, wherein the variable resistor has a rotary operator for varying the resistance value by a rotating operation.

6. The laser light output control apparatus according to claim 1, wherein at least one of the variable resistors of each said output control system has a maximum resistance value different from the variable resistors of the other output control systems.

7. The laser light output control apparatus according to claim 6, wherein the variable resistor has a rotary operator for varying the resistance value by a rotating operation.

8. An image forming apparatus comprising:
a plurality of laser light output control systems including:
a laser light source capable of receiving supplying of current via a power supplying path from a power source and irradiating laser light;
a photo-detecting device capable of receiving the light irradiated from the laser light source and outputting a monitor current dependent on the amount of light received;
a conversion circuit capable of converting the monitor current into a voltage value; and
a control circuit capable of controlling the current supplied to the laser light source based on the voltage value outputted from the conversion circuit so that the intensity of laser light irradiated from the laser light source changes to a predetermined value, wherein the respective conversion circuits of each said output control system have a fixed resistor and a variable resistor connected in series to each other, and wherein at least one of the fixed resistors of each said plurality of laser light output control system has a resistance value different from the fixed resistors of the other plurality of laser light output control systems;
a plurality of photosensitive members arranged in a manner corresponding to laser light sources of each said output control system; and
a plurality of development devices developing a latent image formed in the plurality of photosensitive members.

9. The image forming apparatus according to claim 8, further comprising:
a switching device switching the laser light source to at least one of an ON state and an OFF state according to printing data; and
a charging/discharging circuit which, while performing charging when the laser light source is in an OFF state, discharges a charge accumulated by the charging to the laser light source when the switching device switches the laser light source from an OFF state to an ON state, whereby an overshoot is produced by the discharging at a time when an output of the laser light rises.

10. The image forming apparatus according to claim 9, wherein the laser light source is a laser diode,
wherein the switching device is an NPN transistor, the collector is connected to an anode of the laser diode, the emitter is connected via an emitter resistor to a ground line, a signal corresponding to the printing data being inputted to a base, and
wherein the charging/discharging circuit includes the emitter resistor, a capacitor connected in parallel to the emitter resistor, and a discharging resistor, one end of the discharging resistor being connected to the capacitor, the other end of the discharging resistor being connected to the anode of the laser diode.

11. The image forming apparatus according to claim 10, further comprising:
a main body casing housing the laser light output control device;
a cover for opening/closing an opening in the main body casing;
a first switch connected to the power supplying path of the laser light source, wherein the first switch is capable of closing the power supplying path in response to an operation of closing the cover, further wherein the first switch is capable of opening the power supplying path in response to an operation of opening the cover;
an error amplifier comparing the voltage value with a reference voltage and outputting to the control circuit a control signal dependent on a difference therebetween;
an input line for inputting the reference voltage to the error amplifier;
a second switch connected to the input line and the ground line, wherein the second switch is capable of switching the connection state between both the input and ground line to a conduction state or a non-conduction state; and
a detection circuit capable of detecting an operation of opening the first switch and then causing the connection state of the second switch to change to a conduction state.

12. The image forming apparatus according to claim 11, wherein the power supplying paths for supplying current to the laser light sources of each said output control system are connected to a shared power source line in a branched manner, and at the same time the first switch is disposed in the shared power source line.

13. The image forming apparatus according to claim 11, wherein the respective error amplifiers of each said output control system are connected to the input line, and the reference voltage is inputted through the input line to each said error amplifier.

14. The image forming apparatus according to claim 8, further comprising:
a main body casing housing the laser light output control device;
a cover for opening/closing an opening in the main body casing;
a first switch connected to the power supplying path of the laser light source, wherein the first switch is capable of closing the power supplying path in response to an operation of closing the cover, further wherein the first switch is capable of opening the power supplying path in response to an operation of opening the cover;
an error amplifier comparing the voltage value with a reference voltage and outputting to the control circuit a control signal dependent on a difference therebetween;
an input line for inputting the reference voltage to the error amplifier;
a second switch connected to the input line and the ground line, wherein the second switch is capable of switching the connection state between both the input and ground line to a conduction state or a non-conduction state; and
a detection circuit capable of detecting an operation of opening the first switch and then causing the connection state of the second switch to change to a conduction state.

15. The image forming apparatus according to claim 14, wherein the power supplying paths for supplying current to the laser light sources of each said output control system are connected to a shared power source line in a branched manner, and the first switch is connected to the shared power source line.

16. The image forming apparatus according to claim 14, wherein the respective error amplifiers of each said output control system are connected to the input line, and the reference voltage is inputted through the input line to each said error amplifier.

* * * * *